United States Patent [19]

Schreck et al.

[11] Patent Number: 5,412,603
[45] Date of Patent: May 2, 1995

[54] METHOD AND CIRCUITRY FOR PROGRAMMING FLOATING-GATE MEMORY CELL USING A SINGLE LOW-VOLTAGE SUPPLY

[75] Inventors: John F. Schreck, Lucas; Cetin Kaya, Dallas; David J. McElroy, Allen, all of Tex.

[73] Assignee: Texas Instruments Incorporated, Dallas, Tex.

[21] Appl. No.: 239,008

[22] Filed: May 6, 1994

[51] Int. Cl.⁶ .............................................. G11C 7/00
[52] U.S. Cl. .................. 365/189.01; 365/185; 365/900; 257/289
[58] Field of Search ............ 365/189.01, 185, 900; 257/299

[56] References Cited

U.S. PATENT DOCUMENTS

| | | | |
|---|---|---|---|
| 4,016,588 | 4/1977 | Ohya et al. | 365/185 |
| 4,601,020 | 7/1986 | Arakawa et al. | 365/185 |
| 4,687,312 | 5/1987 | Doung et al. | 365/189.01 |
| 5,267,209 | 11/1993 | Yoshida | 365/900 |
| 5,313,429 | 5/1994 | Chevallier et al. | 365/189.01 |
| 5,341,342 | 8/1994 | Brahmbhatt | 365/185 |

*Primary Examiner*—Do Hyun Yoo
*Assistant Examiner*—Tan Nguyen
*Attorney, Agent, or Firm*—Theodore D. Lindgren; Leo N. Heiting; Richard L. Donaldson

[57] ABSTRACT

The drain-to-source voltage and current for programming a selected nonvolatile memory cell 10 are achieved efficiently by pumping the source 11 of a selected cell 11 to a voltage less than the voltage VSS at the reference-voltage terminal of the memory cell array while, at the same time, pumping the drain 12 of the selected cell 10 to a voltage greater than the voltage VCC, which may be 3 V, at the supply-voltage terminal of the memory cell array. The cell substrate W2 is pumped to a voltage close to the voltage of the source 11 and, optionally, below the voltage of the source 11. One or more simple charge-pump circuits convert the output of the voltage supply VCC to a source-drain voltage and current capable of programming the selected nonvolatile cell 10 by hot carrier injection.

22 Claims, 3 Drawing Sheets

METHOD AND CIRCUITRY FOR PROGRAMMING FLOATING-GATE MEMORY CELL USING A SINGLE LOW-VOLTAGE SUPPLY

BACKGROUND OF THE INVENTION

The present invention relates to a nonvolatile, integrated-circuit memory array such as an electrically erasable, programmable read-only-memory (EEPROM) array or an electrically programmable read-only-memory (EPROM). In particular, the invention relates to a method and circuitry for programming floating-gate memory cells of an array of such cells, the array supplied by a single, low-voltage source of energy.

EEPROMs using hot-carrier-injection programming, as opposed to Fowler-Nordheim tunneling programming, are described in: (a) "A Single Transistor EEPROM cell and its implementation in a 512K CMOS EEPROM", S. Mukherjee et al., IEDM 1985 (p. 616–619) and in (b) "A 90 ns 100K Erase/Program Cycle Megabit Flash Memory", V. Kynett et al., ISSCC 1989 (p. 140–141). The topic of reference (a) is also discussed in U.S. Pat. No. 4,698,787.

During typical prior-art, hot-carrier-injection programming of a selected cell, the voltages applied to the source, drain and control gate of that cell are: (1) a reference voltage equal to the substrate voltage (VSS, which may be 0 V) applied to the source; (2) a first positive voltage VBL, perhaps $+5$ V to $+7$ V with respect to reference voltage, applied to the drain; (3) a second positive voltage VPP, perhaps $+12$ V with respect to reference voltage, applied to the control gate.

Under those conditions, the channel between the drain and source is highly conductive. Electrons reaching the substrate-drain PN junction are subjected to two electric fields, one associated with the reverse-biased substrate-drain PN junction and the other associated with the positive voltage coupled from the control gate to the floating gate. The two electric fields cause electrons (hot carriers) to be injected into the floating gate.

The electric field generated in the silicon substrate near the substrate-drain PN junction and floating-gate interface is the primary factor in determining programmability by hot-carrier injection in floating-gate memories, such as EPROM and Flash EPROM arrays. That electric field is primarily a function of the drain-to-source potential, but also includes other parameters such as the doping profiles of the channel region and the drain region.

One type of floating-gate memory array requires both a five-volt supply and a twelve-volt supply. In such dual-supply memories, the twelve-volt supply is used to furnish the $+5$ V to $+7$ V drain voltage VBL needed during programming. Another type of floating-gate memory array requires a single five-volt-supply. In that single-supply memory, the five-volt supply is pumped by a charge-pump circuit to furnish a drain voltage VBL that is more than $+6$ V during programming. The $+6$ V charge-pump-circuit output is merely a 20% increase over the $+5$ V input, well within capability of charge-pump technology.

Because of the supply voltages available from inexpensive chemical batteries, portable electronic devices such as games and computers are preferably designed to operate with a single three-volt battery supply. Supplying a $+6$ V drain-to-source potential from that three-volt battery supply requires a charge-pump-circuit output that is 100% of the input voltage, rather than the mere 20% of the prior-art example above.

The sizes of circuit elements and the circuit complexity of charge-pump circuits increase dramatically with percentage increase in output voltage over input voltage. Although the programming current requirement remains roughly the same, the capability of the charge-pump circuit to furnish that current falls off rapidly with an increase in ratio of output voltage to input voltage, absent an increase in number of components and a large increase the size of certain of those components.

Specifically, the level of current that a charge-pump circuit can deliver is a function of the output voltage, the size of the capacitors and the frequency of the oscillator used in that charge-pump circuit. As the output voltage demand becomes higher, a given charge-pump circuit is able to deliver less and less current. For example, a single-stage charge-pump circuit is generally capable of delivering an output voltage that approaches twice the supply voltage. But as the voltage approaches twice the supply voltage, the capability of the charge-pump circuit to furnish current becomes very small, even with a very large increase in capacitance. Multiple-stage charge-pump circuits can deliver voltages greater than twice the supply voltage with the same increased circuit-complexity and low-current-output problems.

Additional voltage output from the charge-pump circuit is also required because of the voltage drops incurred in decoding circuitry and bussing.

Hot-carrier-injection programming requires that the charge-pump circuit furnish larger currents than those required using Fowler-Nordheim programming. However, hot-carrier-injection programming is performed with lower electrical fields than those used in Fowler-Nordheim programming. In addition, hot-carrier-injection programming allows programming on a byte-basis.

There is a need for an efficient hot-carrier-injection-programming method and circuitry for use in a floating-gate memory array supplied by a single low-voltage power supply.

SUMMARY OF THE INVENTION

The drain-to-source potential and current required for programming a selected nonvolatile memory cell are achieved efficiently by using a charge-pump circuit to pump the source of a selected cell to a voltage less than the voltage at the reference terminal of the integrated-circuit memory while, at the same time, pumping the drain of the selected cell to a voltage above the voltage at the supply-voltage terminal of the memory. For example, a drain-to-source potential of about 6 V is furnished from a 3 V supply efficiently by using a charge-pump circuit to pump the source voltage to about 1.5 V below the reference terminal of that 3 V supply and, at the same time, to pump the drain voltage to 1.5 V greater than the voltage at the positive terminal of that 3 V supply. The charge-pump circuit is also used to pump the cell substrate voltage to a value near to or lower than the source voltage. For improved programming efficiency, the cell substrate voltage is pumped to a value less than the source voltage.

In the example above, each of the source and drain outputs of the charge-pump circuitry requires a 50% increase in output voltage over the three-volt battery supply, rather than the 100% increase required if prior-art charge-pump circuitry were to be used. Because the sizes of circuit elements and the circuit complexity of charge-pump circuits decrease dramatically as the percentage increase in output voltage over input voltage is lowered, a much smaller die area is required for the charge-pump circuit than for one larger charge-pump circuit. And the increased efficiency is measured by decreased power as well as by decreased die area requirement. The efficiency improves as higher voltages are demanded.

As is known in the prior art, the programming efficiency of a floating-gate cell for a given drain-to-source potential is increased by lowering the substrate potential to a value below the source potential. Reverse-biasing the source-substrate junction increases the charging current in the floating gate for given drain, control gate, and source potentials, while also reducing the amount of substrate current generated during programming. Use of a reverse-biased source-substrate junction permits, for example, a drain-to-source voltage of only +4.5 V rather than the +5 V to +7 V of the prior-art. A drain-to-source voltage of +4.5 V requires the charge-pump circuitry of this invention to provide a 25% increase in output voltage at each terminal over the three-volt battery input. In addition, the decreased source-drain current decreases the voltage drops in decoding circuitry and bussing, which also decreases the demand on charge-pump circuitry.

Providing the required source-to-drain potential by using charge-pump circuitry to lower the source voltage and, simultaneously, to raise drain voltage is a unique, efficient method for generating a source-drain potential and current capable of programming floating-gate cells by hot-carrier injection. Lowering the source and substrate potential while raising the drain potential permits use of a simple, efficient charge-pump circuit for hot-carrier-injection programming of a Flash EPROM or EPROM powered by a single low-voltage supply. Efficiency is further improved by lowering the substrate voltage below the source voltage.

DETAILED DESCRIPTION OF THE INVENTION

Figure 1:
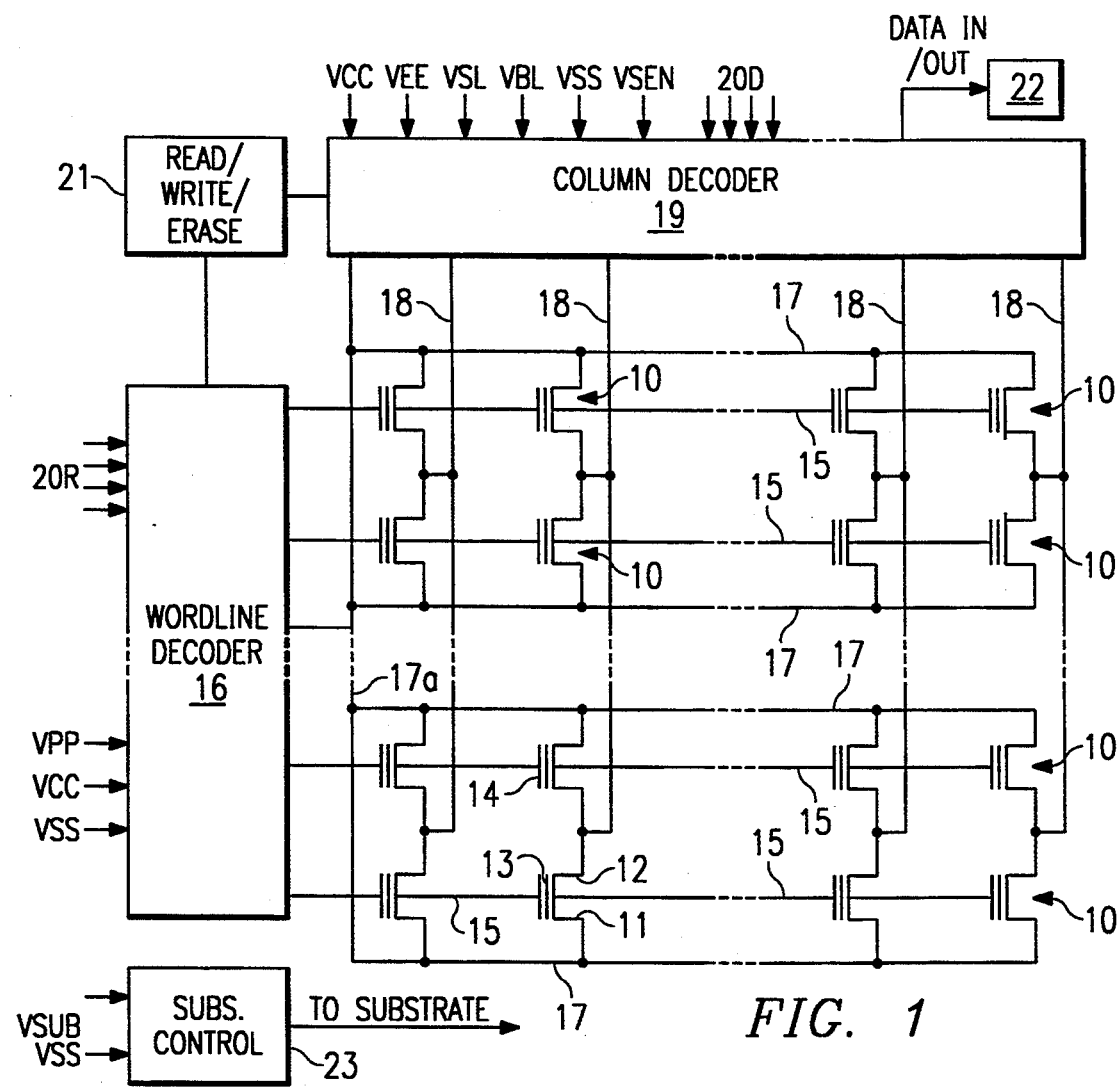
FIG. 1 is an electrical schematic diagram, in partial block form, of a memory cell array.

Referring to FIG. 1, an example array of memory cells, which is an integral part of a memory chip, is shown for the purpose of illustrating use of the method and circuitry of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20R and to signals from Read/Write/Erase control circuit 21 (or microprocessor 21), to apply a preselected positive voltage VCC (approx. +5 V) to the selected wordline 15, and to apply a low voltage (ground or VSS) to deselected wordlines 15. The column decoder 19 functions to apply a preselected positive voltage VSEN (approx. +1 V) to at least the selected drain-column line 18 and to apply a low voltage (0 V) to the source line 17. The column decoder 19 also functions, in response to signals on address lines 20D, to connect the selected drain-column line 18 of the selected cell 10 to the DATA IN/OUT terminal 22. The conductive or nonconductive state of the cell 10 connected to the selected drain-column line 18 and the selected wordline 15 is detected by a sense amplifier (not shown) connected to the DATA IN/OUT terminal 22.

Figure 2:
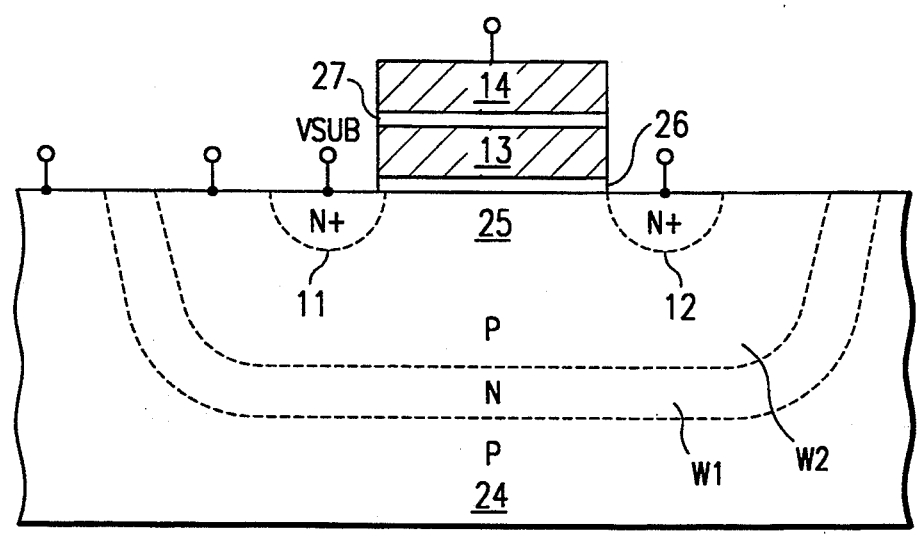
FIG. 2 is a cross-section of a typical floating-gate cell and substrate well of the type used in the memory cell array of FIG. 1.

During a flash-erase mode, the column decoder 19 may function to leave all drain-column lines 18 floating (connected to a high impedance such as field-effect transistor biased in "OFF" condition). Using one option, the wordline decoder 16 functions to connect all the wordlines 15 to a negative voltage VEE (approx. −10 V or −13 V). The column decoder 19 also functions to apply a positive voltage VCC (approx. +5 V or +3 V) to all the source lines 17. In this first option, the substrate isolation well W2 of FIG. 2 is connected by substrate control circuit 23 to VSS, or 0 V. Using a second option, the wordline decoder 16 functions to connect all the wordlines 15 to a negative voltage VEE (approx. −9 V). The column decoder 19 also functions to connect all of the source lines 17 and all of the drain lines 18 to +6 V. The substrate isolation well W2 is also connected to +6 V during this operation. Using either of the options, these erasing voltages create sufficient field strength across the gate oxide region to generate a Fowler-Nordheim tunnel current that transfers charge from the floating gate 13, erasing the memory cell 10. Since the potential on the wordline 15 is a negative voltage, the cell 10 remains in the nonconducting state during erase.

In a prior-art write or program mode, the wordline decoder 16 may function, in response to wordline address signals on lines 20R and to signals from Read/Write/Erase control circuit 21, (or microprocessor 21) to place a preselected first programming voltage VPP (approx. +12 V) on a selected wordline 15, including a selected control-gate 14. Column decoder 19 also functions to place a second programming voltage VBL (approx. +5 to +10 V) on a selected drain-column line 18 and, therefore, the drain 12 of selected cell 10. In the prior-art method and circuitry, source lines 17 are connected to reference potential VSS, which may be ground. All of the deselected drain-column lines 18 are connected to reference potential VSS or are floated. These programming voltages create a high current (drain 12 to source 11) condition in the channel of the selected memory cell 10, resulting in the generation near the drain-channel junction of channel-hot electrons and avalanche-breakdown electrons that are inat the negative terminal of the low-voltage power supply. The substrate isolation well W2 is required to isolate at least the selected cell and perhaps the entire memory cell array to prevent forward biasing of the source 11 and drain 12 diffusions to the substrate. Hot-carrier programming of the selected cell 10 is achieved by applying a pulse of about +10 V on the gate of that selected cell 10. Using one option the deselected wordlines are connected to VSS, or 0 V. Using a second option, deselected wordlines are connected to a voltage about −1 V to −2 V with respect to VSS to prevent deselected cells from leaking.

For convenience, a table of read, write and erase voltages is given in TABLE I below:

TABLE I

|  | Read | Flash Erase | | Program | |
|---|---|---|---|---|---|
|  |  | Option 1 | Option 2 | Option 1 | Option 2 |
| Selected Wordline | 5 V | −10 V or −13 V (All) | −9 V (All) | +12 V − VSL | +12 V − VSL |
| Deselected Wordlines | 0 V | — | — | 0 V | −VSL |
| Selected Drain Line | 1.0 V | Float (All) | +6 V (All) | +6 V − VSL | +6 V − VSL |
| Deselected Drain Lines | 0 V/Float | — | — | Float | Float |
| Source Lines | 0 V | +5 V or +3 V | +6 V (All) | −VSL | −VSL |
| Substrate Isolation Well | 0 V | 0 V | +6 V | −VSL − 2 V | −VSL or −VSL − 2 V |

Note: In Table 1, the source voltage VSL is a positive number having about 1 V to 2 V magnitude.

jected across the channel oxide to the floating gate 13 of the selected cell 10. The programming time is selected to be sufficiently long to program the floating gate 13 with a negative program charge of approximately −2 V to −6 V with respect to the channel region (with the control gate 14 at 0 V). For memory cells 10 fabricated in accordance with the example embodiment, the coupling coefficient between a control gate 14/wordline 15 and a floating gate 13 is approximately 0.6. Therefore, a prior-art programming voltage VPP of 12 V, for example, on a selected wordline 1.5, including the selected control gate 14, places a voltage of approximately +7.2 V on the selected floating gate 13. The voltage difference between the floating gate 13 (at approx. +7.2 V) and the grounded (approx. 0 v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive with +5 V on its control gate, a state which is read as a "zero" bit. Non-programmed cells 10 have source-drain paths under the floating gate 13 that are conductive with +5 V on their control gates, and those cells 10 are read as "one" bits.

In the write, or program, operation according to this invention, the drain-to-source potential required for programming is achieved by using a charge-pump circuit to pump the source 11 of the selected cell 10 to a voltage VSL about −1 V to −2 V below the voltage VSS at the negative terminal of the single low-voltage (perhaps 3 V) supply while, at the same time, pumping the drain 12 of the selected cell 10 to a voltage VBL about +6 V above the voltage at the source. (Using the foregoing examples, the drain voltage VBL is pumped to +4 V to +5 V above the reference voltage VSS.) At the same time, the voltage VSUB of a substrate isolation well W2 in the substrate is connected by substrate control circuit 23 to either to voltage VSUB, which may be the same voltage VSL as the source or to a more negative value about −2 v to −3 V below the voltage VSS FIG. 2 is a cross-section of a typical floating-gate cell 10 of the type used in the memory cell array of FIG. 1. The cell 10 and perhaps the entire memory cell array are formed on a semiconductor substrate 24, which may be of P-type material. A part of the substrate 24 includes a deep well W1 of diffused N-type semiconductor material to which an electrical contact is provided. Deep well W1 encloses a second semiconductor isolation well W2 of diffused P-type semiconductor material to which an electrical contact is provided. A method for constructing an array structure using buried diffusion wells (tanks) is described in U.S. patent application Ser. No. 07/890,577 filed Feb. 28, 1992 entitled "FLASH EEPROM ARRAY WITH P-TANK INSULATED FROM SUBSTRATE BY DEEP N-TANK". That application is also assigned to Texas Instruments Incorporated. Source 11 and drain 12 are formed by impurity diffusion in second semiconductor isolation well W2 having impurity of the opposite-type as the source 11 and drain 12 diffusions. The source 11 is typically formed by a diffusion of two types of impurities. The substrate isolation well W2 area between the source 11 and the drain 12 is the cell channel 25. The floating gate 13 is formed from a layer of polysilicon insulated from the channel 25 by gate insulator 26. The polysilicon control gate 14, which is a part of the wordline 15 of FIG. 1, is insulated from the floating gate 13 by an interlevel insulator 27.

While the above examples use a drain-to-source voltage of in the range of about +5 V to +7 V, there is presently a minimum requirement of only +4.5 V for drain-to-source voltage during the less-than-10-microsecond programming pulse for a floating-gate memory cell.

Figure 3:
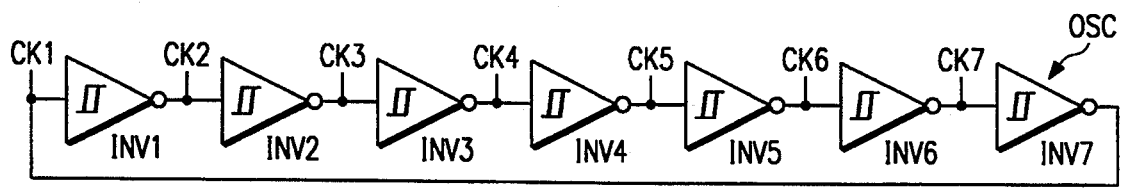
FIG. 3 illustrates an oscillator circuit for use in the charge-pump circuit of this invention.
Figure 4:
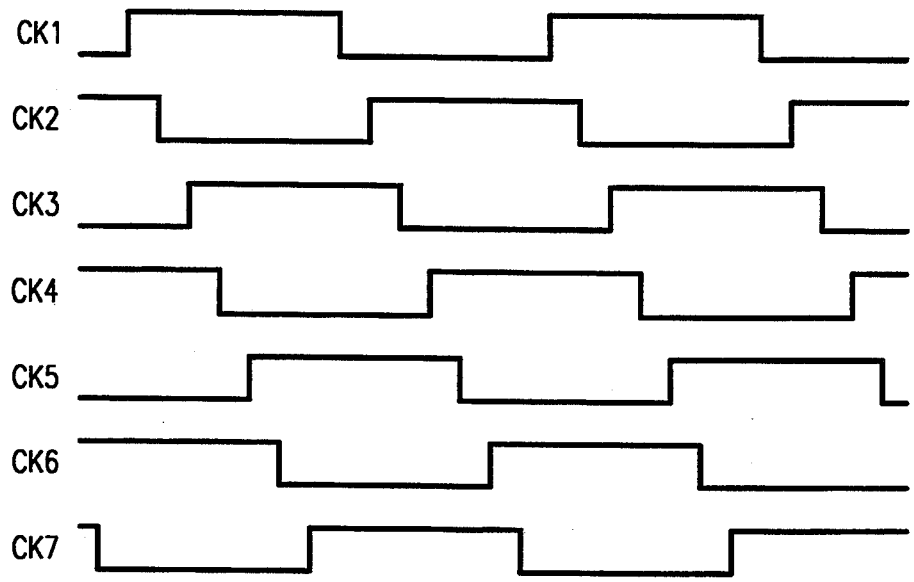
FIG. 4 illustrates the phased output voltages of the charge-pump circuit of FIG. 3.
Figure 5:
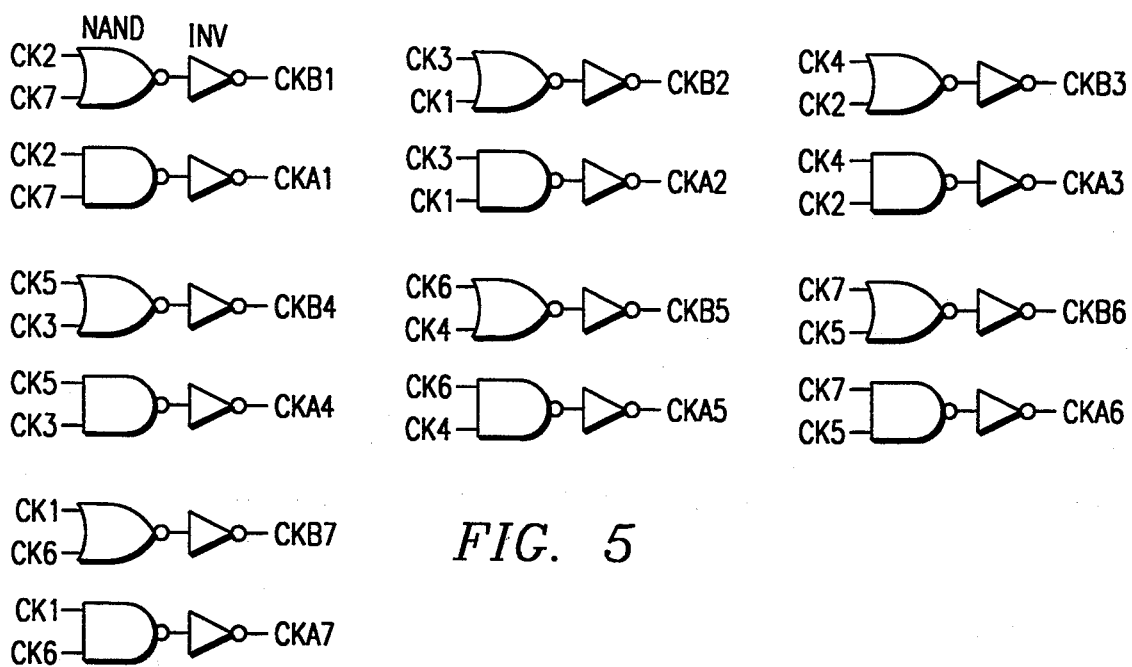
FIG. 5 illustrates circuits for providing modified output voltages using the phased output voltages of FIG. 4.
Figure 6:
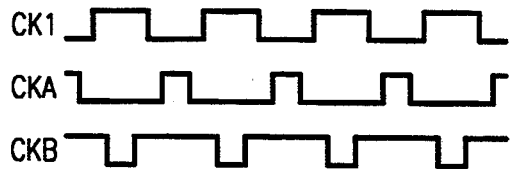
FIG. 6 illustrates a typical modified output voltage of a circuit of FIG. 5 in conjunction with an output voltage of FIG. 4.

Referring now to FIG. 3, an exemplary oscillator circuit OSC is illustrated in block diagram form, the oscillator circuit OSC comprising seven hysteresis-type inverters INV1–INV7 connected in a series loop and having seven phased output terminals, CK1–CK7. The phased output voltages at terminals CK1–CK7 are illustrated in FIG. 4. From these seven outputs, fourteen modified oscillator outputs CKA1–CKA7 and CKB1–CKB7 are derived using the NAND, NOR and inverter circuits of FIG. 5. A typical pair of such modified oscillator outputs, CKA1 and CKB1 are illustrated in FIG. 6, the other outputs being similar. The frequency of the oscillator is, for example, about 10 MHz. The phased voltages at terminals CK1–CK7, CKA1–CKA7 and CKB1–CKB7 vary, for example, between 0 V and +3 V.

Figure 7:
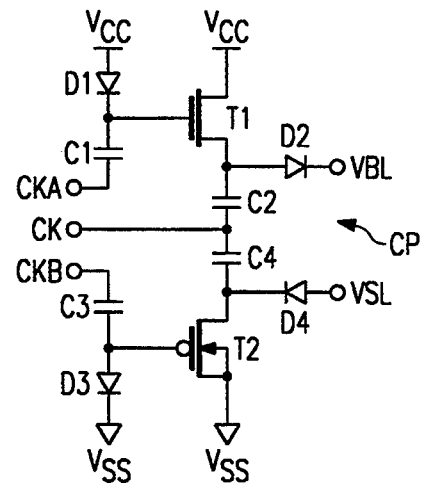
FIG. 7 illustrates one stage of a charge pump circuit utilizing a phased output voltage of FIG. 3 and a pair of modified output voltages of FIG. 6 to produce source and drain voltages for programming.

FIG. 7 illustrates one stage CP of a charge pump to which one of the oscillator outputs CK1–CK7 and to which one pair of the modified oscillator outputs CKA1–CKA7 and CKB1–CKB7 are applied. Specifically, in FIG. 7 one of the oscillator outputs CK1–CK7 is coupled to the terminal CK. One of the modified oscillator outputs CKA1–CKA7 is coupled to terminal CKA and a correspondingly numbered second of the modified oscillator outputs CKB1–CKB7 is coupled to terminal CKB. Terminal CKA is coupled to the gate of N-channel transistor T1 through a capacitor C1. Capacitor C1 may be about one picofarad in size and transistor T1 may have a channel length to width ratio of about 100 to 1. The gate of transistor T1 is coupled to supply voltage VCC, which may be about +3 V, through a diode D1. A first source-drain terminal of transistor T1 is also coupled to supply voltage VCC. A second source-drain terminal of transistor T1 is coupled to terminal CK through a capacitor C2, which may have a capacitance of about 100 picofarads. The second source-drain terminal of transistor T1 is coupled to one output terminal VBL by diode D2.

Further in reference to FIG. 7, terminal CKB is coupled to the gate of P-channel transistor T2 through a capacitor C3. Capacitor C3 may be about one picofarad in size and transistor T2 may have a channel length to width ratio of about 100 to 1. The gate of transistor T2 is coupled to reference voltage VSS, which may be the reference terminal of the 3 V battery supplying VCC, through a diode D3. A first source-drain terminal of transistor T2 is also coupled to reference voltage VSS. The second source-drain terminal of transistor T2 is coupled to terminal CK through a capacitor C4, which may have a capacitance of about 100 picofarads. The second source-drain terminal of transistor T2 is coupled to a second output terminal VSL by diode D4.

Figure 8:
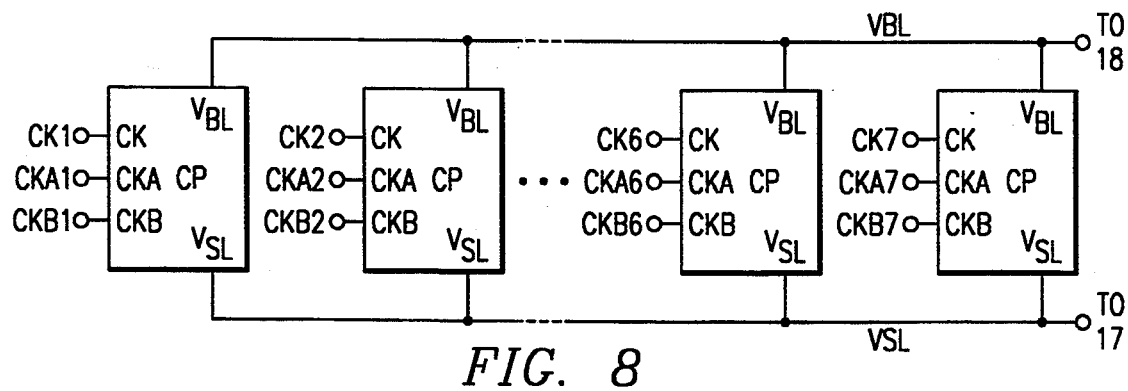
FIG. 8 illustrates connection of seven stages of the charge pump circuits of FIG. 7 and illustrates the voltages and modified voltages of FIGS. 4 and 6 for input to each of the seven stages.

Referring now to FIG. 8, the connection of oscillator signals CK1–CK7 and of modified oscillator signals CKA1–CKA7 and CKB1–CKB7 to stages CP of the charge pump are illustrated. Each of the first output terminals VBL of the charge pump stages CP is connected in parallel to furnish the voltage VBL for biasing the drain-column lines 18 during the programming operation described previously. Each of the second output terminal VSL of the charge pump stages CP is connected in parallel to furnish the voltage VSL for biasing the source lines 17 during the programming operation described previously.

Figure 9:
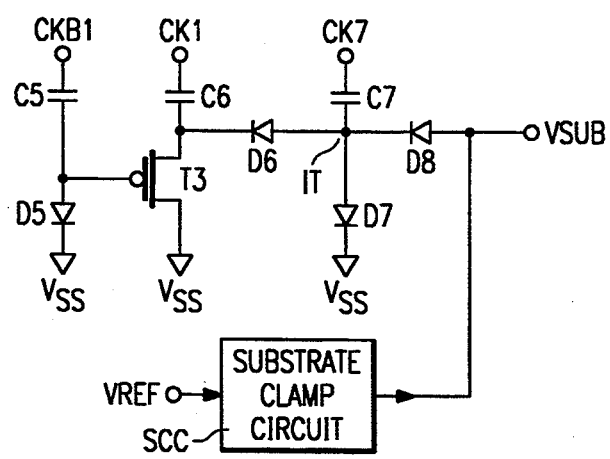
FIG. 9 illustrates a circuit for biasing, during programming, the substrate at a voltage more negative than that of the source.

Referring now to FIG. 9, a circuit providing substrate voltage at terminal VSUB is illustrated. Modified oscillator output CKB1 if coupled to the gate terminal of P-channel field-effect transistor T3 through capacitor C5. The gate of P-channel field-effect transistor T3 is coupled to reference voltage VSS by diode D5. Oscillator output CK1 is coupled to a first source-drain terminal of transistor T3 through a capacitor C6. A second source-drain terminal of transistor T3 is coupled to reference voltage VSS. The first source-drain terminal of transistor T3 is coupled to intermediate terminal IT through diode D6. Oscillator output CK7 is coupled to intermediate terminal IT through capacitor C7. Intermediate terminal IT is coupled to reference terminal VSS through diode D7. Intermediate terminal IT is coupled through diode D8 to the substrate at terminal VSUB. The substrate voltage VSUB may be clamped to a second reference voltage VREF by a substrate clamp circuit SCC in well-known manner.

The drain-to-source potential required for programming a selected cell is achieved efficiently by using the charge-pump circuit described above to pump the source 11 to a voltage less than the voltage VSS at the negative terminal of a single low-voltage supply while, at the same time, pumping the drain 12 to a voltage greater than the voltage VCC at the positive terminal of that low-voltage supply. For example, a drain-to-source potential of +6.5 V is furnished from a 3 V supply efficiently by using a charge-pump circuit to pump the source 11 voltage to 1.75 V less than (negative voltage) the voltage VSS at the negative terminal of that 3 V supply and, at the same time, pump the drain 12 voltage to a voltage 1.75 V greater than the voltage VCC at the positive terminal of that 3 V supply. The charge-pump circuit is also used to pump the cell substrate W2 voltage to a value near or lower than the source 11 voltage. For improved programming efficiency, the cell substrate W2 voltage is pumped to a value less than the source 11 voltage.

While the examples above have discussed only one type of floating-gate cell 10, this invention is useful in nonvolatile memories using any type of non-split-gate nonvolatile memory cell 10.

While this invention has been described with respect to an illustrative embodiment, this description is not intended to be construed in a limiting sense. In particular, this invention is applicable to use with power supplies having voltage outputs less than three-volt example used herein. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for programming a floating-gate memory cell in a nonvolatile integrated-circuit memory having a reference-voltage terminal and a supply-voltage terminal, said cell having a drain, a source and a control gate, said method comprising:

applying a first voltage to said source of said memory cell, said first voltage less than the voltage at said reference-voltage terminal;

applying a second voltage to said drain of said memory cell, said second voltage greater than the voltage at said supply-voltage terminal;

applying a third voltage to said control gate, said third voltage greater than the voltage at said reference-voltage terminal.

2. The method of claim 1, further including said memory cell formed in and on a semiconductor substrate, wherein said method includes applying said first voltage to said semiconductor substrate.

3. The method of claim 1, further including said memory cell formed in and on a semiconductor isolation well, wherein said method includes applying a fourth voltage to said semiconductor isolation well, said fourth voltage less that said first voltage.

4. The method of claim 1, wherein the voltage at said reference-voltage terminal is 0 V, the voltage at said supply-voltage terminal is 3 V, and said first voltage is a negative voltage.

5. The method of claim 1, further including said memory cell formed in and on a semiconductor substrate, wherein said semiconductor substrate is P-type material and wherein said source and said drain are N-type material.

6. The method of claim 1, further including charge-pump circuitry, wherein said charge-pump circuitry comprises:

an oscillator output coupled to a first terminal of said charge-pump circuitry;

a first and second modified oscillator outputs coupled to second and third terminals of said charge-pump circuitry, respectively;

said second terminal of said charge-pump circuitry coupled to a gate of a first transistor by a first capacitor, said gate of first transistor coupled to said supply-voltage terminal by a first diode;

a first source-drain terminal of said first transistor coupled to said supply-voltage terminal;

a second source-drain terminal of said first transistor coupled to said first terminal of said charge-pump circuitry by a second capacitor;

said second source-drain terminal of said first transistor coupled to said drain of said memory cell by a second diode;

said third terminal of said charge-pump circuitry coupled to a gate of a second transistor by a third capacitor;

said gate of said second transistor coupled to said reference-voltage terminal by a third diode;

a first source-drain terminal of said second transistor coupled to said reference-voltage terminal;

a second source-drain terminal of said second transistor coupled to said first terminal by a fourth capacitor; and a second source-drain terminal of second transistor coupled to said source of said memory cell by a fourth diode.

7. The charge-pump circuitry of claim 6, wherein at least one of said first and third capacitors is one picofarad in size.

8. The charge-pump circuitry of claim 6, wherein at least one of said second and fourth capacitors is 100 picofarads in size.

9. The charge-pump circuitry of claim 6, wherein at least one said first and second transistors has a channel, said channel having a length-to-width ratio of 100 to 1.

10. A nonvolatile integrated-circuit memory having a floating-gate cell selected for programming, said memory having a reference-voltage terminal and a supply-voltage terminal, said cell having a drain, a source and a control gate, said memory comprising:

charge pump circuitry for pumping said source of said memory cell during programming to a first voltage less than the voltage at said reference-voltage terminal;

charge pump circuitry for pumping said drain of said memory cell during programming to a second voltage greater than the voltage at said supply-voltage terminal;

circuitry for applying a third voltage greater than the voltage at said reference-voltage terminal to said control gate during programming.

11. The memory of claim 10, further including said memory cell formed in and on a semiconductor substrate, wherein said charge pump circuitry is used to pump said semiconductor substrate to said first voltage.

12. The memory of claim 10, further including said memory cell formed in and on a semiconductor isolation well, wherein said charge pump circuitry is used to pump said semiconductor isolation well to a fourth voltage less that said first voltage.

13. The memory of claim 10, further including a second floating-gate cell not selected for programming, said second floating-gate cell having a control gate, said memory including circuitry for applying the voltage at said reference-voltage terminal to said control gate of said second floating-gate cell.

14. The memory of claim 10, further including a second floating-gate cell not selected for programming, said second floating-gate cell having a control gate, said memory including circuitry for applying said first voltage to said control gate of said second floating-gate cell.

15. The memory of claim 10, wherein the voltage at said reference-voltage terminal is 0 V, the voltage at said supply-voltage terminal is 3 V, and said first voltage is a negative voltage.

16. The memory of claim 10, further including said memory cell formed in and on a semiconductor substrate, wherein said semiconductor substrate is P-type material and wherein said source and said drain are N-type material.

17. The memory of claim 10, wherein said charge pump circuitry comprises:

an oscillator output coupled to a first terminal of said charge-pump circuitry;

a first and second modified oscillator outputs coupled to second and third terminals of said charge-pump circuitry, respectively;

said second terminal of said charge-pump circuitry coupled to a gate of a first transistor by a first capacitor, said gate of first transistor coupled to said supply-voltage terminal by a first diode;

a first source-drain terminal of said first transistor coupled to said supply-voltage terminal;

a second source-drain terminal of said first transistor coupled to said first terminal of said charge-pump circuitry by a second capacitor;

said second source-drain terminal of said first transistor coupled to said drain of said memory cell by a second diode;

said third terminal of said charge-pump circuitry coupled to a gate of a second transistor by a third capacitor;

said gate of said second transistor coupled to said reference-voltage terminal by a third diode;

a first source-drain terminal of said second transistor coupled to said reference-voltage terminal;

a second source-drain terminal of said second transistor coupled to said first terminal by a fourth capacitor; and a second source-drain terminal of second transistor coupled to said source of said memory cell by a fourth diode.

18. The charge-pump circuitry of claim 17, wherein at least one of said first and third capacitors is one picofarad in size.

19. The charge-pump circuitry of claim 17, wherein at least one of said second and fourth capacitors is 100 picofarads in size.

20. The charge-pump circuitry of claim 17, wherein at least one said first and second transistors has a channel length-to-width ratio of 100 to 1.

21. Circuitry for programming a floating-gate memory cell in a nonvolatile integrated-circuit memory having a reference-voltage terminal and a supply-voltage terminal, said cell having a drain, a source and a control gate, said circuitry comprising:

means for applying a first voltage to said source of said memory cell, said first voltage less than the voltage at said reference-voltage terminal;

means for applying a second voltage to said drain of said memory cell, said second voltage greater than the voltage at said supply-voltage terminal;

means for applying a third voltage greater than the voltage at said reference-voltage terminal to said control gate.

22. The circuitry of claim 21, further including said memory cell formed in and on a semiconductor isolation well, further comprising:

means for applying a fourth voltage to said semiconductor isolation well, said fourth voltage less than said first voltage.

* * * * *